United States Patent
Hirasawa et al.

(10) Patent No.: US 10,321,611 B2
(45) Date of Patent: Jun. 11, 2019

(54) POWER CONVERSION APPARATUS

(71) Applicant: DENSO CORPORATION, Kairya, Aichi-pref. (JP)

(72) Inventors: Naoki Hirasawa, Nishio (JP); Ryota Tanabe, Kariya (JP); Taijiro Momose, Kariya (JP); Hiromi Ichijo, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/978,507

(22) Filed: May 14, 2018

(65) Prior Publication Data

US 2018/0332732 A1 Nov. 15, 2018

(30) Foreign Application Priority Data

May 15, 2017 (JP) ................. 2017-096596

(51) Int. Cl.
*H05K 7/20* (2006.01)
*H02M 7/00* (2006.01)
*H05K 7/14* (2006.01)
*H05K 5/02* (2006.01)

(52) U.S. Cl.
CPC .......... *H05K 7/2089* (2013.01); *H02M 7/003* (2013.01); *H05K 5/0217* (2013.01); *H05K 7/1401* (2013.01); *H05K 7/20927* (2013.01)

(58) Field of Classification Search
CPC ............................................ H05K 7/20927
See application file for complete search history.

(56) References Cited

U.S. PATENT DOCUMENTS

| | | | | |
|---|---|---|---|---|
| 8,665,623 | B2 * | 3/2014 | Suzuki | H02M 7/003 363/141 |
| 8,717,760 | B2 * | 5/2014 | Iguchi | H05K 7/20927 165/80.4 |
| 9,466,415 | B2 * | 10/2016 | Nobusaka | H01F 27/16 |
| 9,565,792 | B2 * | 2/2017 | Ishikawa | H05K 7/20927 |
| 9,735,700 | B2 * | 8/2017 | Takeuchi | H02M 7/003 |
| 9,773,759 | B2 * | 9/2017 | Hirasawa | B60L 11/1874 |
| 9,894,812 | B2 * | 2/2018 | Sakamoto | B60K 6/405 |
| 9,986,665 | B2 * | 5/2018 | Kosaka | H05K 7/20254 |
| 10,135,356 | B2 * | 11/2018 | Takeuchi | H02M 7/003 |

(Continued)

FOREIGN PATENT DOCUMENTS

| | | | | |
|---|---|---|---|---|
| JP | 2014-099488 A | 5/2014 | | |
| WO | WO-2015087129 A1 * | 6/2015 | | H01L 23/473 |

*Primary Examiner* — Robert J Hoffberg
(74) *Attorney, Agent, or Firm* — Oliff PLC

(57) ABSTRACT

A power conversion apparatus includes a semiconductor module, an electronic component, a cooling member, a casing and a pressurizing member. The electronic component includes a load application part that receives a load caused by pressurizing force on a surface in a pressurizing member side with respect to the lamination direction; a load supporting part that comes into contact with a contact part of the casing on a surface opposite to the pressurizing member side with respect to the lamination direction; and a fastening part fastened to a casing fastening part. The load supporting part is disposed between the load application part and the fastening part; moment of force around the load supporting part is produced in the electronic component by the load applied to the load application part; and the moment causes the electronic component to be pressed towards a pressed part of the casing.

8 Claims, 11 Drawing Sheets

(56) References Cited

U.S. PATENT DOCUMENTS

| | | | | |
|---|---|---|---|---|
| 10,136,564 B2* | 11/2018 | Takeuchi | ............ | H05K 7/20927 |
| 2015/0357109 A1 | 12/2015 | Nobusaka et al. | | |
| 2016/0227677 A1* | 8/2016 | Hirasawa | ........... | H05K 7/20927 |
| 2018/0070480 A1* | 3/2018 | Hirasawa | .............. | B60L 15/007 |

* cited by examiner

POWER CONVERSION APPARATUS

CROSS-REFERENCE TO RELATED APPLICATION

This application is based on and claims the benefit of priority from earlier Japanese Patent Application No. 2017-96596 filed May 15, 2017, the description of which is incorporated herein by reference.

BACKGROUND

Technical Field

The present disclosure relates to a power conversion apparatus having semiconductor modules, electronic components, and a cooling member.

Description of the Related Art

Some types of power conversion apparatus as inverters or converters are provided with semiconductor modules, reactors and cooling members that cool these modules and components. For example, Japanese Patent Laid-Open Publication Number 2014-99488 discloses a structure in which semiconductor modules, a reactor and a cooling member are laminated. The laminate composed of the semiconductor modules, the reactor and the cooling member is pressed in the lamination direction, whereby adhesion between the semiconductor module and the cooling member, and adhesion between the reactor and the cooling member are enhanced.

Since the reactor has a small heat quantity compared to the semiconductor module, the required heat radiation can be small. On the other hand, as described above, when a load is applied to the laminate, a load being applied to the reactor substantially equals to a load being applied to the semiconductor module. That is, the load applied to the reactor may become excessively high. Then, the reactor size may be required to be larger in order to enhance the load resistance.

Further, in this case, a fixing force of the reactor with respect to the casing in a direction perpendicular to the lamination direction is a concern because of vibration or the like of the power conversion apparatus. Also, similar problems arise in a configuration in which other electronic components instead of the reactor are laminated together with the semiconductor modules and the cooling member.

SUMMARY

The present disclosure has been achieved in light of the above-described circumstances and provides a power conversion apparatus capable of miniaturizing the electronic components and improving the fixing force of the electronic components with respect to the casing.

As a first aspect of the present disclosure, a power conversion apparatus is provided including a semiconductor module; an electronic component electrically connected to the semiconductor module; a cooling member that cools the semiconductor module and the electronic component, the cooling member being laminated with the semiconductor module and the electronic component to form a laminate; a casing that accommodates the laminate; and a pressurizing member that pressurizes the laminate in a lamination direction. The electronic component includes: a load application part that receives a load caused by the pressurizing force of the pressurizing member on a surface in a pressurizing member side with respect to the lamination direction; a load supporting part that comes into contact with a contact part of the casing on a surface opposite to the pressurizing member side with respect to the lamination direction; and a fastening part fastened to a casing fastening part of the casing.

The load supporting part is disposed between the load application part and the fastening part with respect to the lamination direction; moment of force around the load supporting part is produced in the electronic component by the load applied to the load application part; and the moment causes the electronic component to be pressed towards a pressed part which constitutes a part of the casing.

In the above-described power conversion apparatus, the electronic component has the above-described load supporting part. The load supporting part is disposed between the load application part and the fastening part with respect to the lamination direction. Thus, the load applied by the load application part does not influence the entire electronic component over the lamination direction, but influences a part of the load application part. Hence, increasing size of the electronic component caused by securing the load resistance can be minimized.

Further, the electronic component includes the above-described fastening part. Thus, the electronic component is fastened to the casing at the fastening part, thereby being fixed to the casing stably.

Moreover, the electronic component is configured such that moment of force around the load supporting part is produced in the electronic component by the load applied to the load application part and the moment causes the electronic component to be pressed towards a pressed part which constitutes a part of the casing. Accordingly, a part of the load applied to the load application part is converted to the force that presses the electronic component towards the pressed part. As a result, the fixing force of the electronic components with respect to the casing can be improved.

As described, the above-described aspects can provide a power conversion apparatus capable of miniaturizing the electronic components and improving the fixing force of the electronic components with respect to the casing. It should be noted that the bracketed reference signs in this column and in the claims indicate correspondence to specific means in the embodiments described later, and do not limit the technical scope of the present disclosure.

DETAILED DESCRIPTION OF THE PREFERRED EMBODIMENTS

First Embodiment

Figure 1:
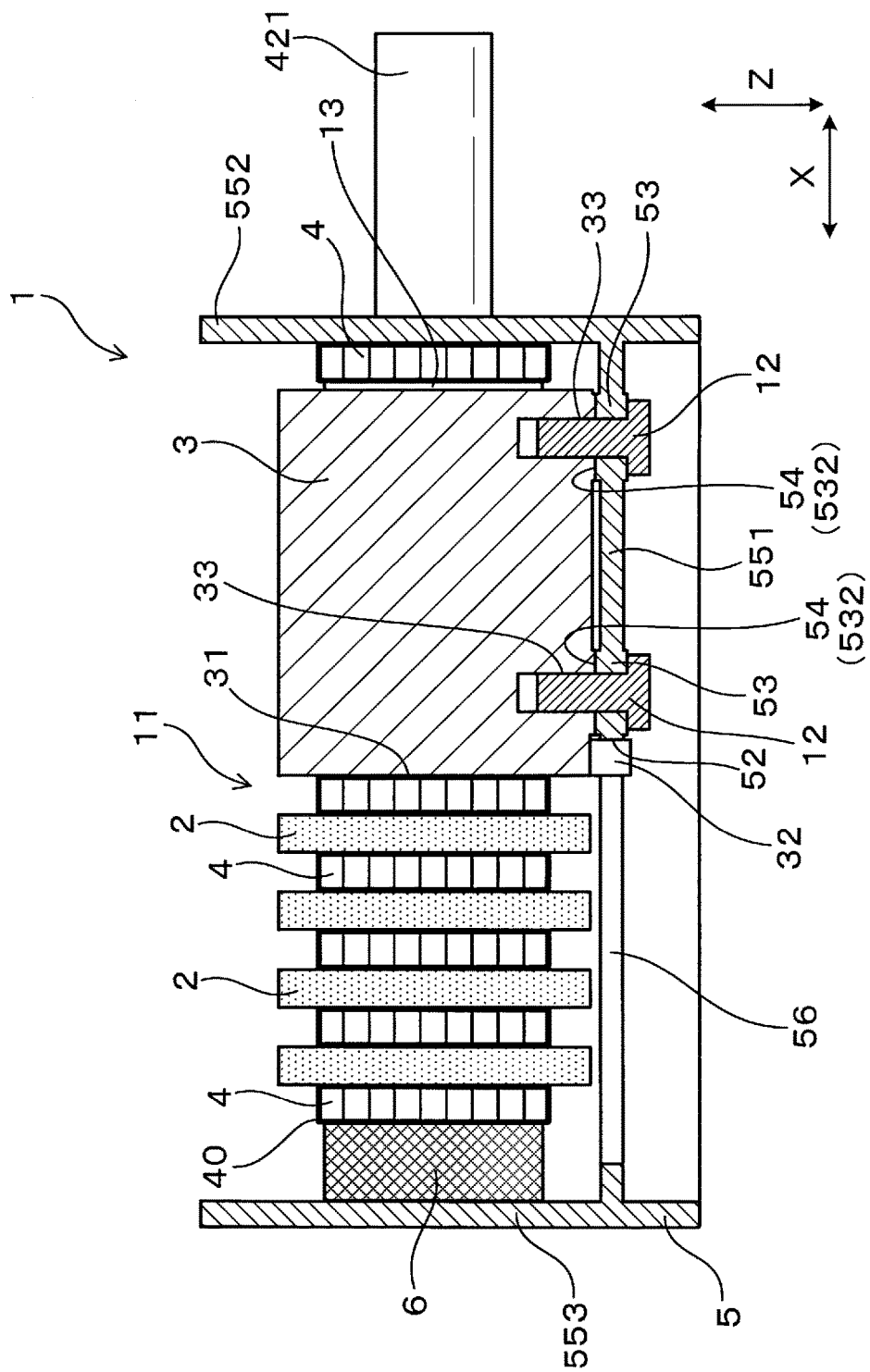
FIG. 1 is a cross-sectional view snowing a power conversion apparatus according to a first embodiment, being sectioned along I-I line shown in FIG. 2.

With reference to FIGS. 1 to 9, an embodiment of a power conversion apparatus will be described. As shown in FIGS. 1 to 4, the power conversion apparatus 1 according to the first embodiment is provided with semiconductor modules 2, a reactor 3 as an electronic component, a cooling pipe 4 as a cooling member, a casing 5 and a pressurizing member 6.

The reactor 3 is electrically connected to the semiconductor module 2. The cooling member 4 is laminated together with the semiconductor modules 2 and the reactor 3 to constitute a laminate 11, and cools the semiconductor modules 2 and the reactor 3. The casing 5 accommodates the laminate 11. The pressurizing member 6 presses the laminate 11 in the lamination direction X.

As shown in FIGS. 1, 7 to 9, the reactor 3 includes a load application part 31, a load supporting part 32 and a fastening part 33. The load application part 31 receives a load caused by a pressing force of the pressurizing member 6 on a pressurizing member 6 side surface with respect to the lamination direction X. The load supporting part 32 comes into contact with a contact part 52 of the casing 5 on a surface opposite to a pressurizing member 6 side with respect to the lamination direction Z. The fastening part 33 is fastened to a casing fastening part 53 of the casing 5.

The load supporting part 32 is formed between the load application part 31 and the fastening part 33 in the lamination direction X. In the reactor 3, moment of force around the load supporting part 32 is produced by the load applied to the load application part 31. Thus, the moment causes the reactor 3 to be pressed towards a pressed part 54 which constitutes a part of the casing 5.

The power conversion apparatus 1 according to the first embodiment can be used as an inverter mounted on an electric vehicle or a hybrid vehicle or the like. The power conversion apparatus 1 is configured to perform power conversion between a DC (direct current) power source and a AC (alternating current) rotary electric machine. Further, the power conversion apparatus 1 according to the first embodiment includes a boost converting part that boosts the voltage of the DC power source, in which the reactor 3 serves as a part of the boost converting part. Each of the semiconductor modules 2 includes a switching element.

As shown in FIGS. 1 to 4, a plurality of cooling pipes 4 are arranged in the lamination direction X to be in parallel with each other. The cooling pipes 4 is configured such that coolant passes through inside thereof. The cooling pipes 4 are arranged such that the longitudinal direction thereof, which is a direction along which the coolant passes through, is perpendicular to the lamination direction X. The longitudinal direction of the cooling pipe 4 corresponds to the width direction Y which will be described later. The cooling pipes 4 arranged adjacently in the lamination direction X are coupled by a connecting pipe 41 in the vicinity of both end portions thereof in the width direction Y. Note that the connecting pipe 41 may be configured of a portion integrated to the cooling pipe 4 or may be configured of a part other than the cooling pipe 4.

In the plurality of cooling pipes 4, the cooling pipe 4 disposed on one end of the lamination direction X is arranged such that a coolant introduction pipe 421 and a coolant discharging pipe 422 extend in the lamination direction X. According to the power conversion apparatus 1 of the present embodiment, a part where the coolant introduction pipe 421 and the coolant discharging pipe 422 are arranged is defined as a front part, and the opposite part is defined as a rear part. Also, a direction perpendicular to the lamination direction X and the width direction W is defined as a height direction Z. However, expressions such as front/rear and upper/lower are used for the sake of convenience and do not limit the arrangement and the posture of the power conversion apparatus 1.

Figure 6:
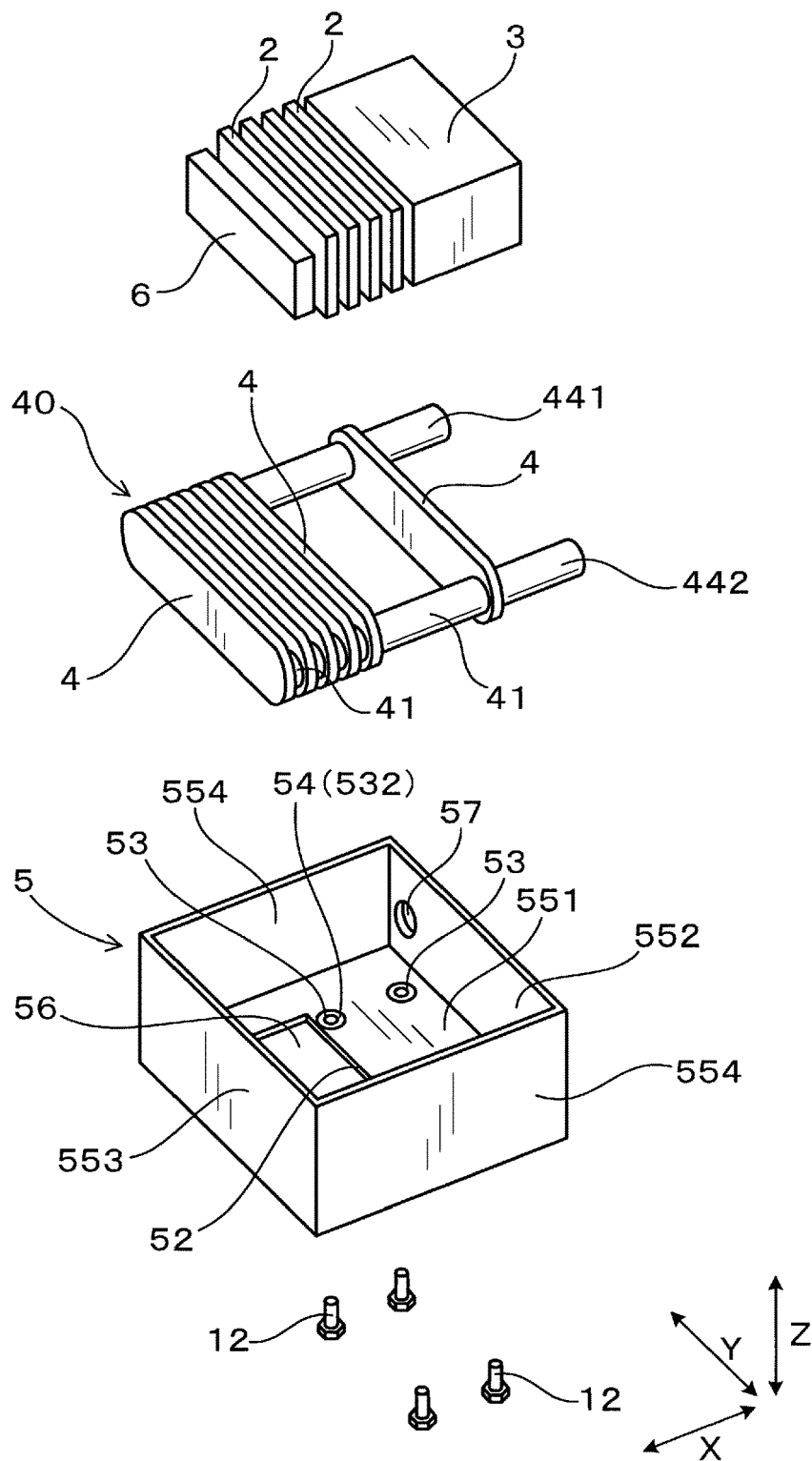
FIG. 6 is a disassembled perspective view of the power conversion apparatus according to the first embodiment.

The plurality of cooling pipes 4, the plurality of connecting pipes 41, the coolant introduction pipe 421 and the coolant discharging pipe 422 are arranged as described above and assembled together whereby the cooling unit 40 is constituted as shown in FIG. 6. Moreover, as shown in FIGS. 1 to 4, the semiconductor module 2 and the reactor 3 are arranged between adjacent cooling pipes 4 in the lamination direction X. The reactor 3 is supported between the front end cooling pipe 4 in the lamination direction X and the second cooling pipe 4 from the front end cooling pipe 4. The plurality of cooling pipes 4 other than the front end cooling pipe 4 and the plurality of semiconductor modules 2 are alternately arranged in the lamination direction X.

The plurality of cooling pipes 4 which contact with the semiconductor module 2 are arranged to have the same intervals therebetween in the lamination direction X. On the other hand, an interval between the front end cooling pipe 4 and the second cooling pipe 4 from the front end cooling pipe 4 is larger than each interval of the plurality of cooling pipes 4 other than the front end cooling pipe 4. Thus, the connecting pipe 41 located at the front end is longer in the lamination direction X than other connecting pipes 41 located in rear side.

The semiconductor modules 2 and the reactor 3 are configured such that the coolant flowing through the cooling pipes 4 is capable of cooling the semiconductor modules 2 and the reactor 3. specifically, the coolant introduced into a cooling unit 40 from the coolant introduction pipe 421 is distributed to the plurality of cooing pipes 4 via the connecting pipes 41, thereby flowing therethrough. During this period, the coolant exchanges heat with the semiconductor modules 2 or the reactor 3. The coolant receiving the heat is discharged from the cooling unit 40 through the coolant discharging pipe 422. Thus, the semiconductor modules 2 and the reactor 3 are cooled in this manner.

Also, the cooling pipe 40 is configured to be capable of being deformed such that intervals between cooling pipes 4 located adjacently in the lamination direction X become small by a pressing force of the pressurizing member 6. For example, the connecting pipes 41 can be compressive deformed in the lamination direction X, or a diaphragm structure can be provided at a connecting portion between a cooling pipe 4 and a connecting pipe 41. Each of the cooling pipes 4 is made of a metal having good thermal conductivity such as aluminum. Moreover, the connecting pipes 41 that constitute the cooling unit 40, the coolant introduction pipe 421 and the coolant discharging pipe 422 are made of the same type of metal as the cooling unit 4.

Also, the casing 5 can be made of metal such as aluminum. As shown in FIG. 6, the casing 5 has substantial rectangular parallelepiped shape and a shape having an open face at one side in the height direction Z. The open face side of the casing 5 is defined as upper (upper side) and the opposite side thereof is defined as lower (lower side) for the sake of convenience. The casing 5 has a bottom plate part 551 having a normal direction in the height direction Z, a front wall part 552 that stands towards upper side from the front end of the bottom plate part 551, a rear wall part 553 that stands towards upper side from the rear end of the bottom plate part 551, and a pair of side wall parts 554 that stands towards upper side from the side end of the bottom plate part 551.

Figure 3:
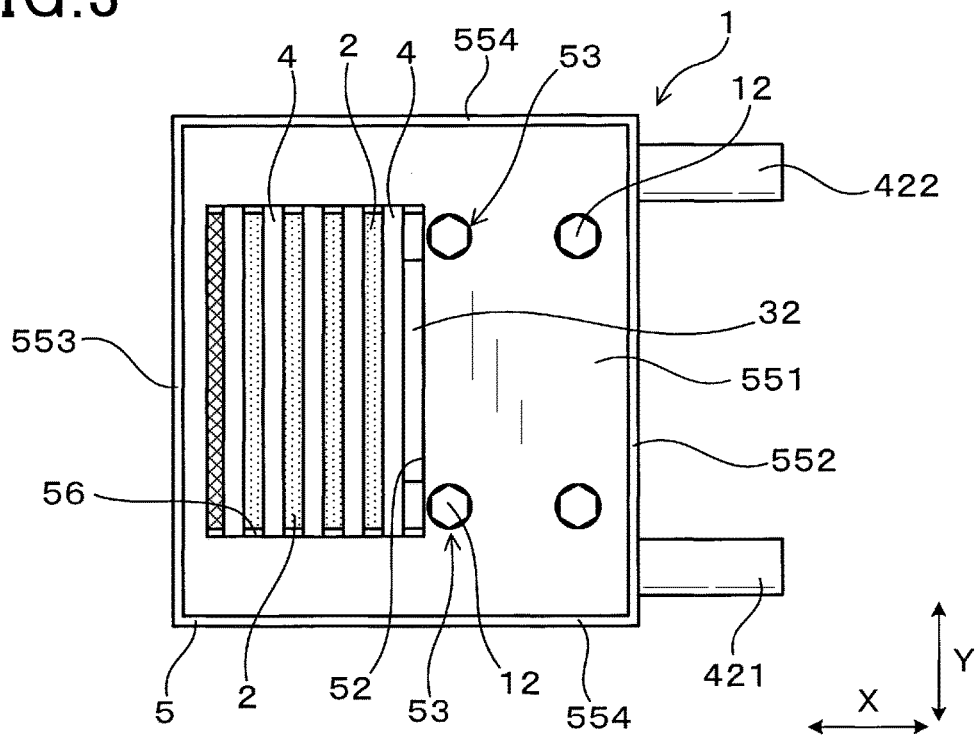
FIG. 3 is a bottom view showing the power conversion apparatus according to the first embodiment.
Figure 4:
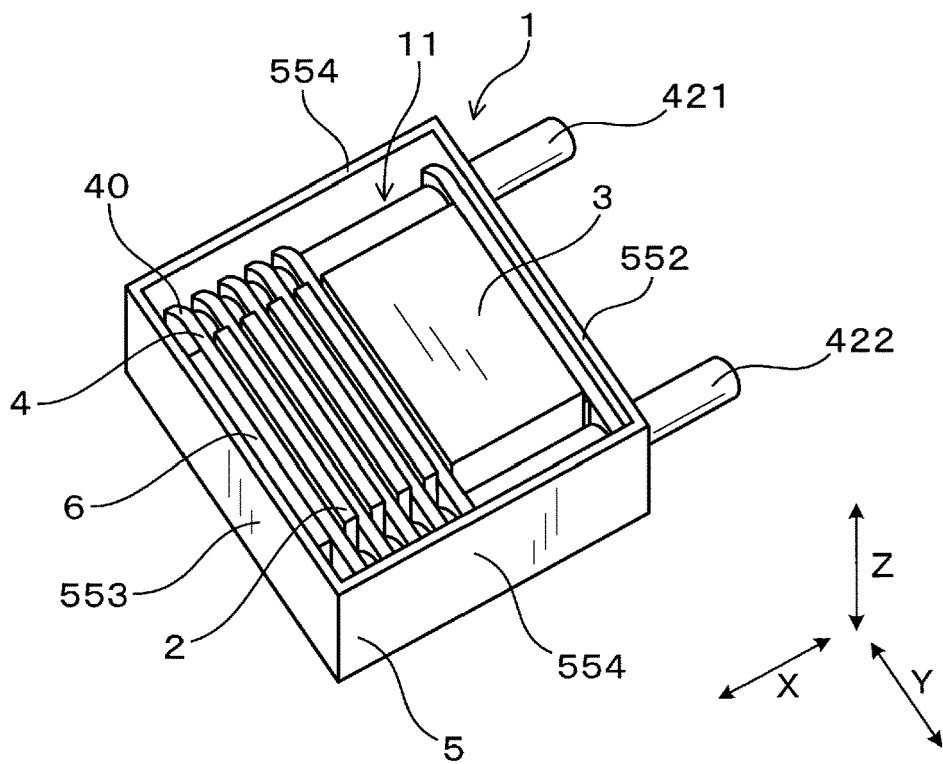
FIG. 4 is a perspective view showing the power conversion apparatus according to the first embodiment.
Figure 5:
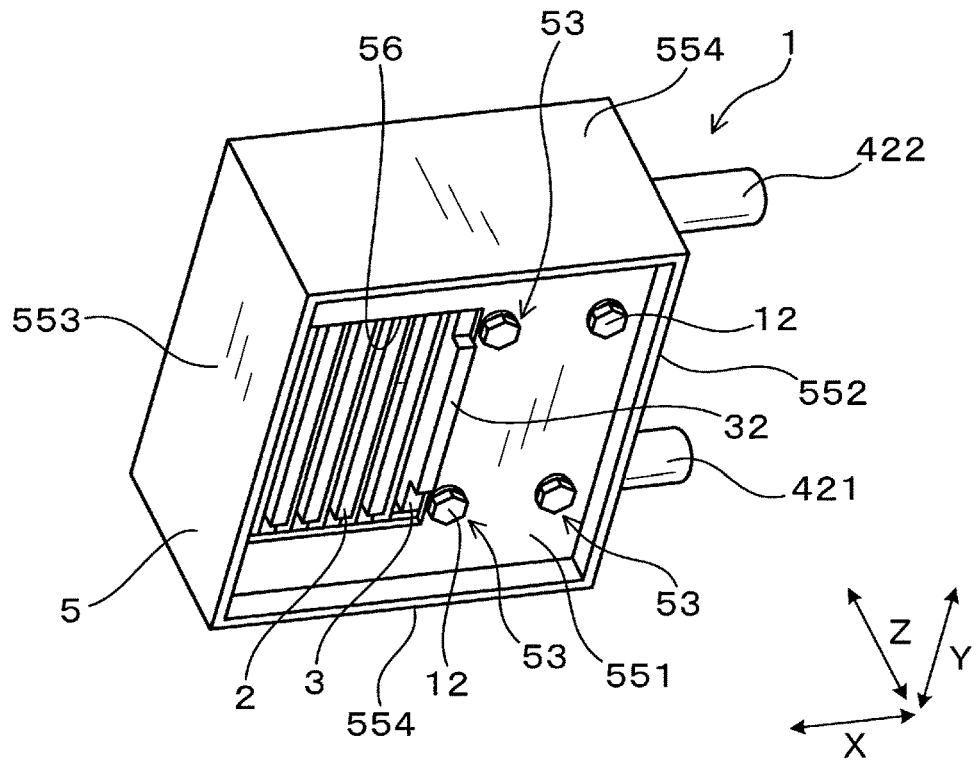
FIG. 5 is another perspective showing the power conversion apparatus according to the first embodiment.

In the front wall part 552, a through hole 57 is formed, which allows the coolant introduction pipe 421 and the coolant discharging part 422 to penetrate therethrough. Also, in the bottom plate part 551, an opening 56 that partially penetrates therethrough in the height direction Z. The opening 56 is formed in the rectangular shape as shown in FIG. 3. The opening 56 is opened at a portion overlapping the plurality of semiconductor modules 2 in the height direction Z. The front end of the opening 56 serves as a contact part 52 to which the load supporting part 32 contacts.

Figure 7:
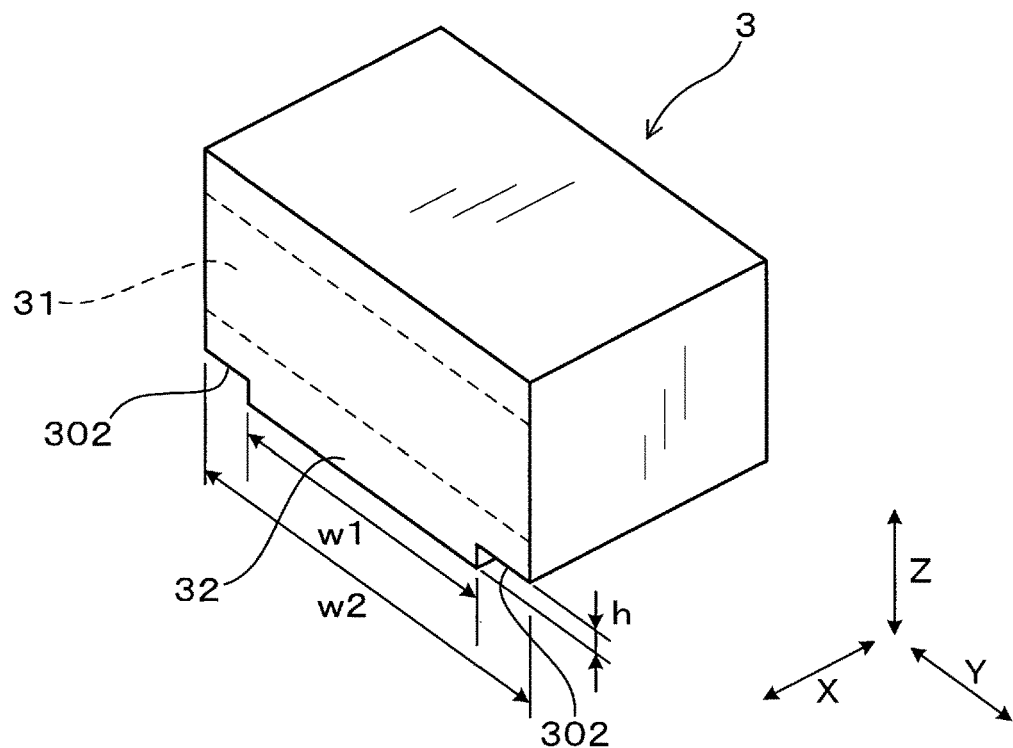
FIG. 7 is a perspective view of a reactor according to the first embodiment.
Figure 8:
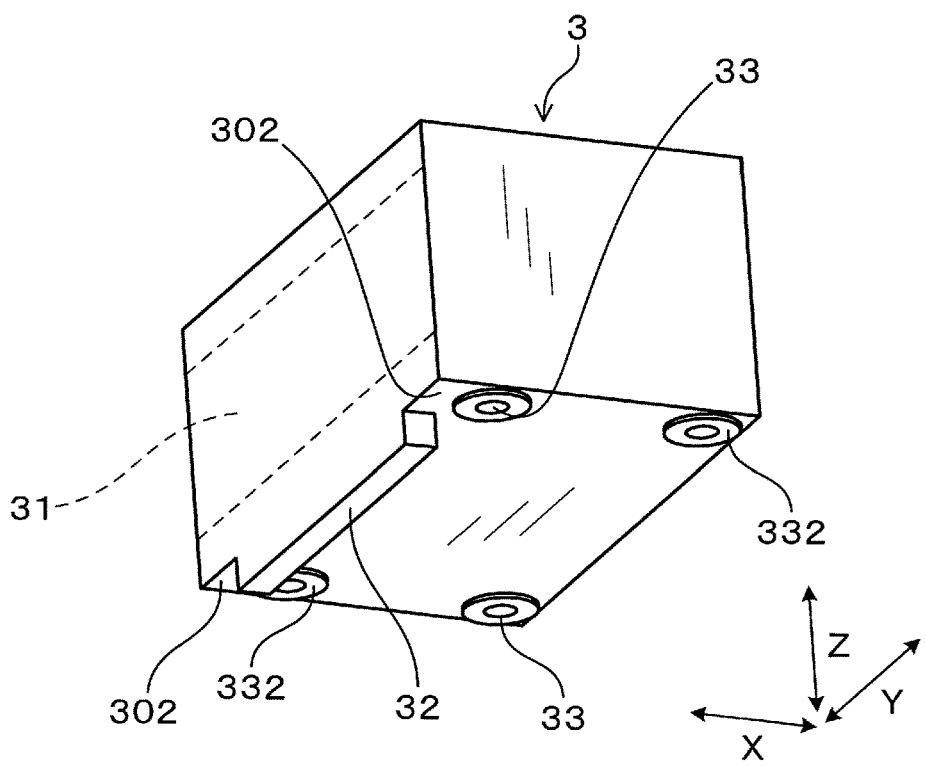
FIG. 8 is another perspective view of the reactor according to the first embodiment.

Also, as shown in FIGS. 1 and 6, the bottom plate part 551 includes the casing fastening part 53 to which the fastening part 33 is fixed. The fastening part 33 of the reactor 3 is fastened (fixed) to the casing fastening part 53 by the bolt 12 as a fastening member. In the reactor 3, four fastening parts 33 are formed. In other words, as shown in FIGS. 7 and 8, the reactor 3 has substantial rectangular parallelepiped shape, in which the fastening part 33 is formed in each of the four corner portions. According to the present embodiment, as the fastening part 33, a female screw part is formed on the bottom surface of the reactor 3. The bolt 12 is inserted into the fastening part 33 from the casing fastening part 53. That is, the bolt 12 is inserted into the casing fastening part 53 from the lower side of the bottom plate part 551 of the casing 5, and is screwed into the fastening part 33 provided to the bottom part of the reactor 3.

As shown in FIGS. 1, 2, 7 and 8, the reactor 3 includes the load application part 31 in the rear surface thereof. The rear surface of the reactor 3 is formed in a planar shape, in which a part of the rear surface 3 surface-contacts with the cooling pipes 4. A portion where the cooling pipes 4 surface-contacts is the load application part 31. Also, the load supporting part 32 protrudes towards the lower side from the rear end part in the bottom surface of the reactor 3. The rear surface of the load supporting part 32 constitutes a part of the rear surface of the reactor 3 which is located on the same plane as the load application part 31. The front surface of the load application part 31 comes into contacts with the contact part 52 of the casing 5.

As shown in FIGS. 1 to 4, the front wall part 552 faces the laminate 11 from the front side. The rear wall portion 553 faces the laminate 11 from the rear side. The coolant introduction pipe 421 and the coolant discharging pipe 422 penetrates through the front wall part 552 and protrudes towards the front side. However, positions of the coolant introduction pipe and the coolant discharging pipe are not limited. However, the coolant introduction pipe and the coolant discharging pipe may be provided to the rear end of the cooling pipe 40.

The pressurizing member 6 being elastic-compressed is located between the rear wall part 553 and the laminate 11. Thus, the restoring force of the pressurizing force 6 influences the laminate 11 in the lamination direction X. However, the load supporting part 32 of the reactor 3 comes into contact with the contact part 52 of the casing 5. Hence, the pressurizing force influences the lamination part between the semiconductor modules 2 and the cooling pipes 4. The load caused by pressurizing force of the pressurizing member 6 also influences the load supporting part 32 of the reactor 3 via the semiconductor module 2 and the cooling pipes 4. However, the load produced in the lamination direction X caused by the pressurizing force of the pressurizing member 6 does not influence the rear side than the load supporting part 32 is.

Figure 9:
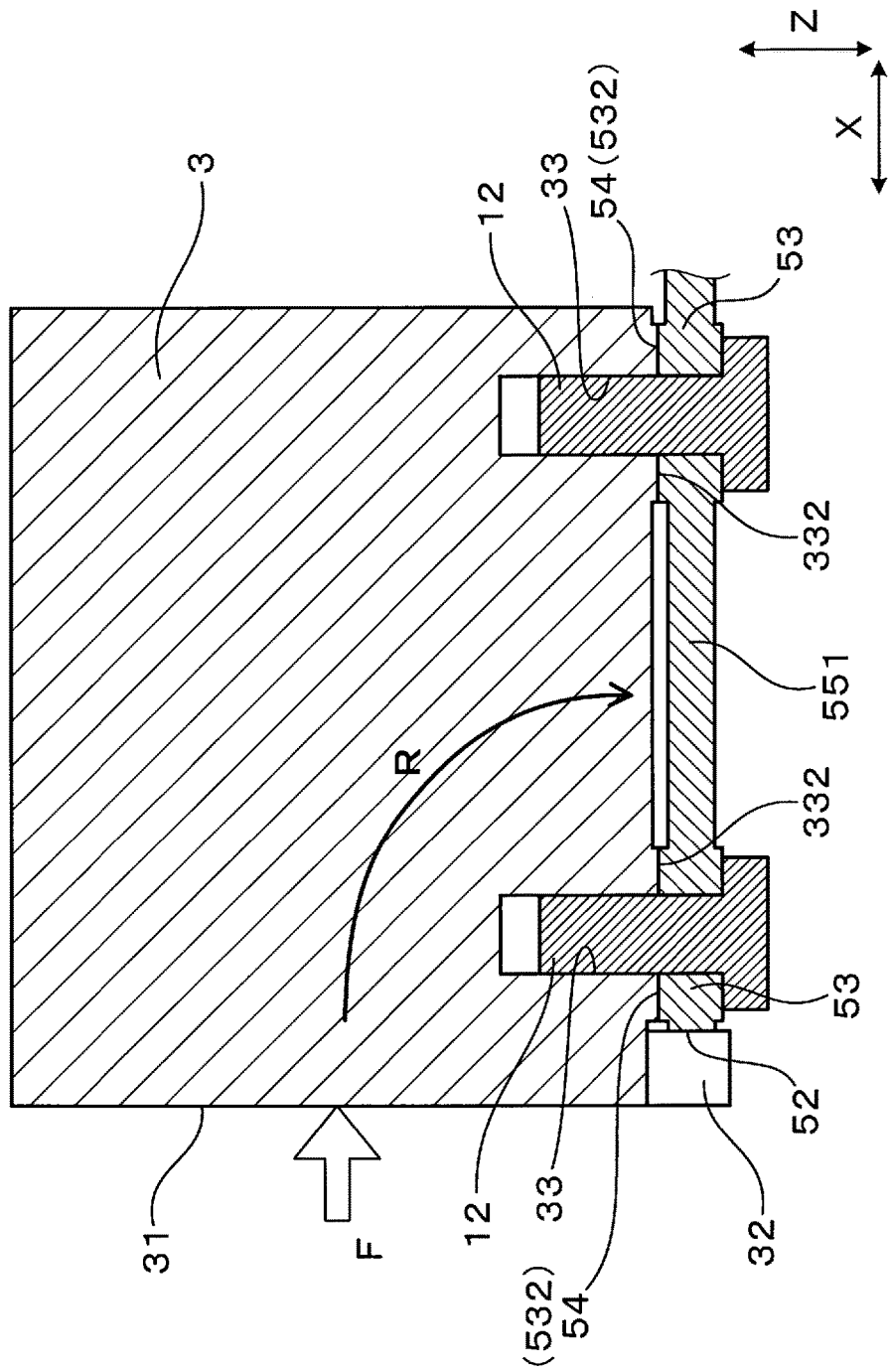
FIG. 9 is an explanatory diagram showing moment of force applied to the reactor according to the first embodiment.

The load supporting part 32 is present in a position shifted towards the lower side in the height direction Z with respect to the load application part 31. Accordingly, as shown in FIG. 9, when a load F is applied to the load application part 31 in the lamination direction X, a moment around the load supporting part influences the reactor 3 so that force that makes the reactor 3 rotate is produced in a direction indicated by an arrow R. Then, the bottom surface of the reactor 3 is pressed towards the bottom plate part 551 of the casing 5.

More specifically, as shown in FIGS. 8 and 9, a component seat surface 332 is formed around the fastening part 33 on the bottom surface of the reactor 3. The component seat surface 332 partly protrudes slightly towards the lower side. Also, as shown in FIG. 9, a casing seat surface 532 is formed around the casing fastening part 53. The casing seat surface 532 partly protrudes slightly towards the upper side. The component seat surface 332 surface-contacts with the casing seat surface 532. The casing seat surface 532 is pressed by the component seat surface 332. In other words, the casing seat surface 532 is defined as the pressed part 54 which is pressed by the reactor 3. The casing part 53 to which the reactor 3 is fixed by the bolt 12

A direction of the fastening force of the bolt 12 corresponds to the direction of pressing force between the reactor 3 and the pressed part 54. Specifically, according to the present embodiment, the bolt 12 is fastened in the height direction Z from the opposite side of the direction along which the pressing force is applied to the pressed part. In other words, the bolt 12 is inserted through the lower side of the bottom plate part 551 of the casing 5 and fastened to the fastening part 33 of the reactor 3 located in an upper side of the bottom plate part 551.

The load application part 31 orthogonally crosses the pressed part 53. That is, the load application part 31 is a plane oriented to the lamination direction X, and the bottom plate part 551 including the pressed part 53 has a normal direction in the height direction Z. Also, the pressed part 54 which is the casing seat surface 532 provided at the bottom plate part 551 has a normal direction in the height direction Z.

As shown in FIGS. 7 and 8, the load supporting part 32 has a dimension w1 in the width direction Y which is a direction perpendicular to the lamination direction and parallel to the pressed part 54, and the dimension w1 is larger than a dimension h in the height direction Z. Also, as shown in FIG. 9, the dimension h in the height direction Z of the load supporting part 32 is substantially the same as the thickness of the bottom plate part 53 or slightly larger than the thickness of the bottom plate part 53.

As shown in FIG. 7, the load supporting part 32 has a dimension w1 in the width direction Y which is smaller than the dimension w2 of the reactor 3 in the width direction Y. That is, the load supporting part 32 is not formed over the entire length in the width direction Y of the reactor 3 but formed in a part of the length thereof. Specifically, a non-protruded part 302 is provided, at both end portions in the rear end part of the bottom surface of the reactor 3. The non-protruded part 302 is a part where the load supporting part 32 is not formed. As shown in FIG. 8, the fastening part 33 is formed in the vicinity of the non-protruded part 302.

Thus, the load supporting part 32 is formed in a position shifted in the width direction Y with respect to the fastening part 33. According to the present embodiment, the fastening part 33 is formed in each of four positions. The four fastening parts 33 are provided in positions shifted in the width direction W with respect to the load supporting part 32. The fastening parts 33 located in positions close to the load supporting part 32 in the lamination direction X may be disposed in positions shifted in the width direction Y with respect to the load supporting part 32, and other fastening parts 33 may be disposed in positions not shifted in the width direction Y with respect to the load supporting part 32.

Figure 2:
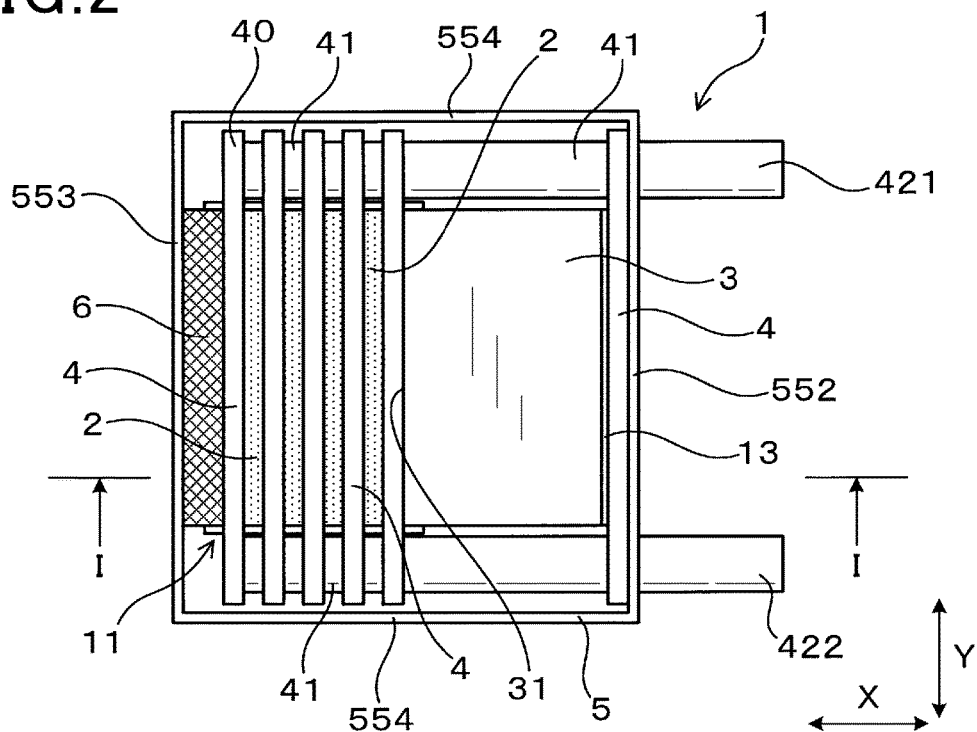
FIG. 2 is a plan view showing the power conversion apparatus according to the first embodiment.

As shown in FIGS. 1 and 2, the cooling pipe 4 is also provided between the reactor 3 and the front wall part 552. The cooling pipe 4 serves as the cooling pipe 4 located in the front end of the laminate 11. An elastic member 13 having thermal conductivity is provided between the reactor and the cooling pipe 4 located in the front end of the laminate 11. As described above, a load of the pressurizing member 6 is not applied to the front side than the load supporting part 32 of the reactor 3 is. Hence, the cooling pipe 4 located in the front side and the reactor 3 are not pressure-contacted by the pressurizing member 6. The elastic member 13 is located between the front side cooling pipe 4 and the reactor 3 while being elastic compressed. The load applied to the front side of the reactor 3 is smaller than the load applied to the load application part 31 in the rear surface of the reactor 3. The elastic member 13 may be made of silicone sheet or the like.

Although, illustration is omitted, the pressurizing member 6 can be formed of a plate spring, for example. The plate spring can be formed by bending a spring steel. Moreover, a pressure contact plate having high rigidity can be located between the plate spring and the cooling pipe 4. Thus, the cooling pipe 4 can be prevented from being deformed by a local pressurizing force received by the plate spring.

The semiconductor module 2 is produced by molding a switching element with resin. The semiconductor module 2 may be provided such that a plurality of switching elements are integrated thereto, or the switching elements and diodes are integrated thereto. As shown in FIG. 6, the semiconductor module 2 has a substantial rectangular parallelepiped shape in which the dimension of the laminate direction X is smaller than that of the width direction Y and the height direction Z. Also, the semiconductor module 2 is formed such that terminals (not shown) are protruded from a resin portion towards the height direction Z. The reactor 3 includes a coil (not shown) and terminals (not shown) are protruded towards one side in the height direction Z.

Next, effects and advantages of the present embodiment will be described. According to the above-described power conversion apparatus 1, the reactor 3 has the load supporting part 32. The load supporting part 32 is formed between the load application part 31 and the fastening parts 33 in the lamination direction. Thus, the load applied by the load application part 31 does not influence the entire reactor 3 in the lamination direction X but influences only a part of the load application part 31. Accordingly, increasing of the size of the reactor 3 because of securing the load resistance can be reduced.

Also, the reactor 3 includes the fastening parts 33. The reactor 3 is fastened to the casing 5 at the fastening parts 33 so that the reactor 3 can be stably fixed to the casing 5.

In the reactor 3, moment is produced around the load supporting part 32 by the load applied to the load application part 31. Thus, the reactor 3 is pressed by the pressed part 54 which constitutes a part of the casing 5. Hence, a part of the load applied to the load application part 31 is converted to force that causes the reactor 3 to press the pressed part 54. As a result, the fixing force of the reactor 3 to the casing 5 can be improved.

Note that mass of the reactor 3 is larger than that of the semiconductor module 2. Hence, as described above, the fixing force of the reactor 3 to the casing 5 can be improved, thereby effectively improving the vibration resistance.

The fastening parts 33 are fastened to the casing fastening part 53 by the bolts 12. The direction of the fastening force of the bolt 12 corresponds to the pressing force between the reactor 3 and the pressed part 54. That is, the direction of the axial force of the bolt 12 and the direction of the pressing force are matched. Therefore, the pressing force caused by the moment effectively assists the fastening force between the casing fastening part 53 and the fastening parts 33.

The casing fastening member 53 is provided in the pressed part 54. That is, the reactor 3 is pressed to the casing fastening member 53 of the bottom plate part 551 of the casing 5. Hence, the pressing force caused by the moment can effectively assist the fastening force between the casing fastening member 53 and the fastening parts 33.

Also, the bolt 12 is inserted into the fastening parts 33 from the casing fastening member 53. In other words, the bolt 12 is inserted towards the reactor 3 from the bottom plate part 551 of the casing 5, and screwed therebetween. Thus, space for disposing the bolt 12 and space for a tool used for fastening the bolt 12 in the voltage conversion apparatus 1 can readily be secured, and the size of the power conversion apparatus 1 can be reduced.

The load application part 31 and the load supporting part 32 orthogonally cross the pressed part 54. Hence, the reactor 3 is pressed towards the casing 5 in a direction orthogonal to the load application direction with respect to the reactor 3, that is, the height direction Z, where by the reactor 3 can be stabilized.

Further, in the load supporting part 32, the dimension w1 in the width direction Y is larger than the dimension h in the height direction Z. Hence, length of the contact portion of the load supporting part 32 in the width direction Y can be longer with respect to the contact part 52 of the casing 5. In other words, in the above-described contact portion, length of a direction along the rotational axis of the moment of force can be longer. Thus, the load resistance of the load supporting part 32 can be larger.

Also, in the load supporting part 32, the dimension w1 in the width direction Y is smaller than the dimension w2. The load supporting part 32 is formed in a position shifted in the width direction Y with respect to the fastening parts 33. Thus, as shown in FIG. 3, head of the bolt 12 that fastens the fastening part 33 and the casing fastening part 53 is prevented from being excessively close to the load supporting part 32. Accordingly, it is likely to avoid that the head of the bolt 12 or the tool interferes the load supporting part 32.

As described above, according to the above-described embodiment, a power conversion apparatus can be provided in which the size of the reactor 3 can be small while the fixing force of the reactor with respect to the casing can be improved.

Second Embodiment

As shown in FIGS. 10 to 15, in the power conversion apparatus 1 of the second embodiment, the bolt 12 is fastened towards the casing fastening part 53 from the fastening part 33. In other words, according to the present embodiment, a plurality of flange portions are formed in the lower end part of the reactor 3 as the fastening member 33. In each of the flange portions, an insertion hole is formed that allows the bolt 12 to penetrate therethrough.

Figure 11:
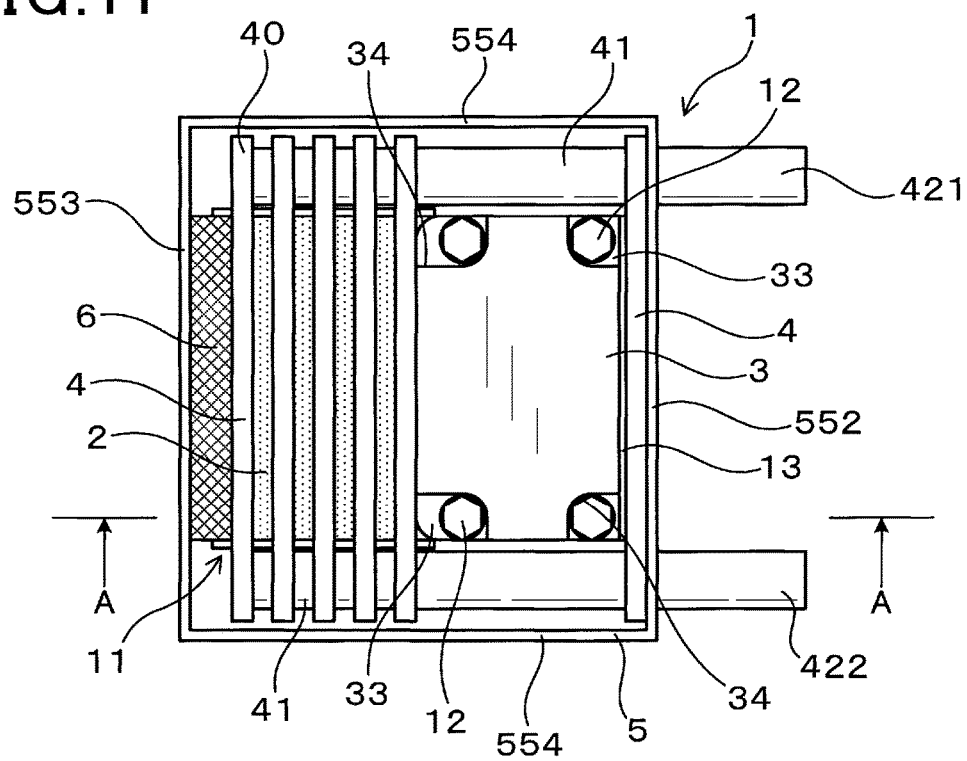
FIG. 11 is a plan view showing the power conversion apparatus according to the second embodiment.
Figure 12:
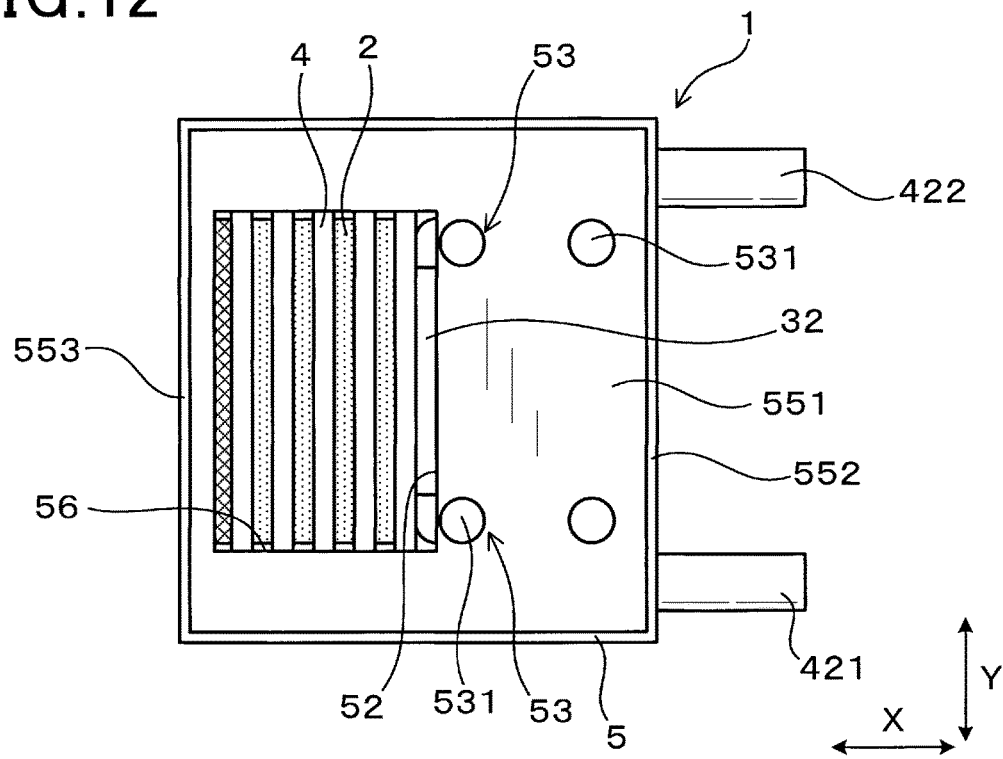
FIG. 12 is a bottom view showing the power conversion apparatus according to the second embodiment.
Figure 13:
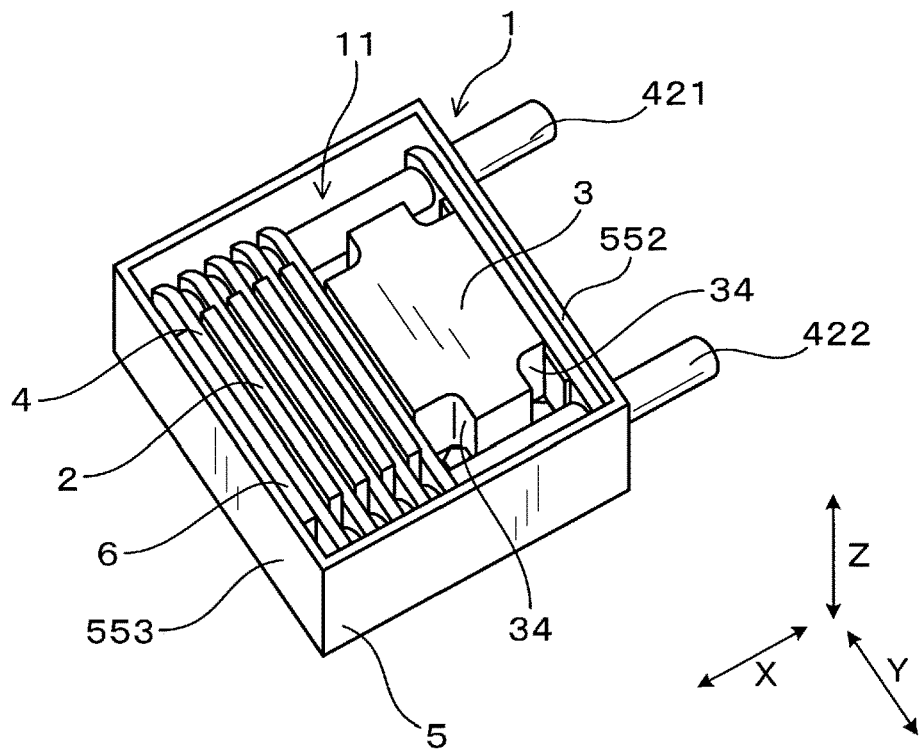
FIG. 13 is a perspective view showing the power conversion apparatus according to the second embodiment.
Figure 14:
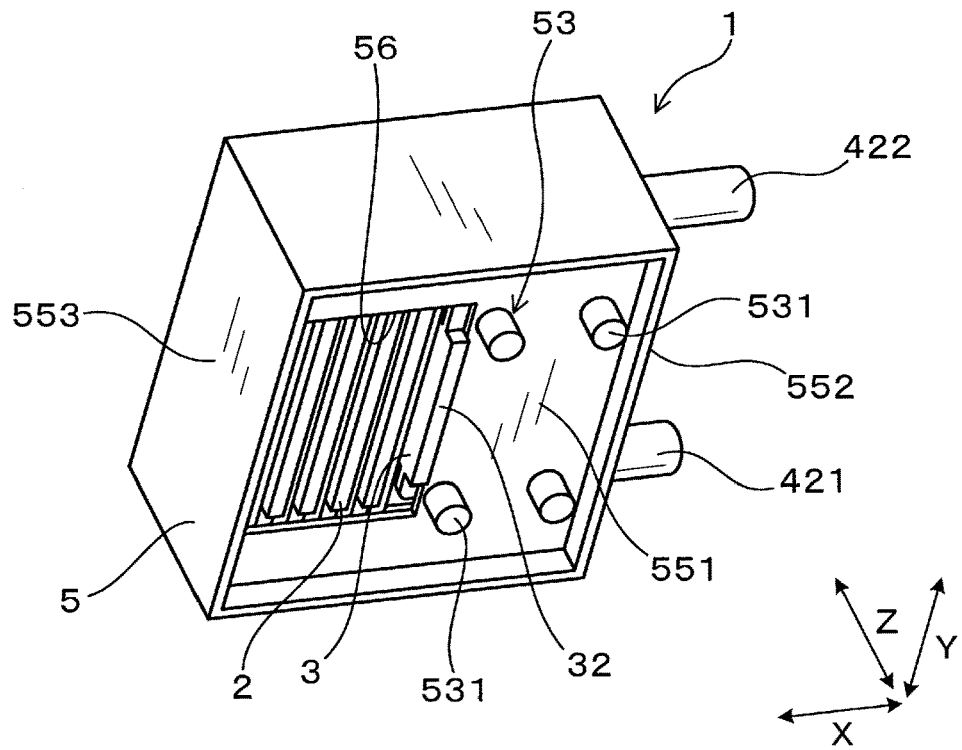
FIG. 14 is another perspective view showing the power conversion apparatus according to the second embodiment.
Figure 16:
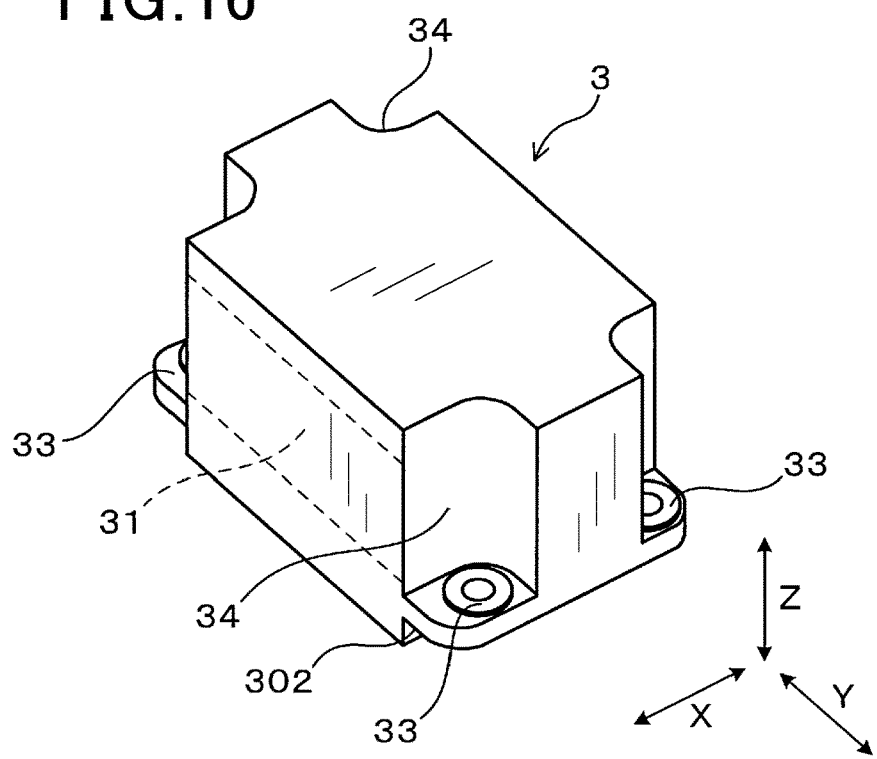
FIG. 16 is a perspective view showing the reactor according to the second embodiment.
Figure 17:
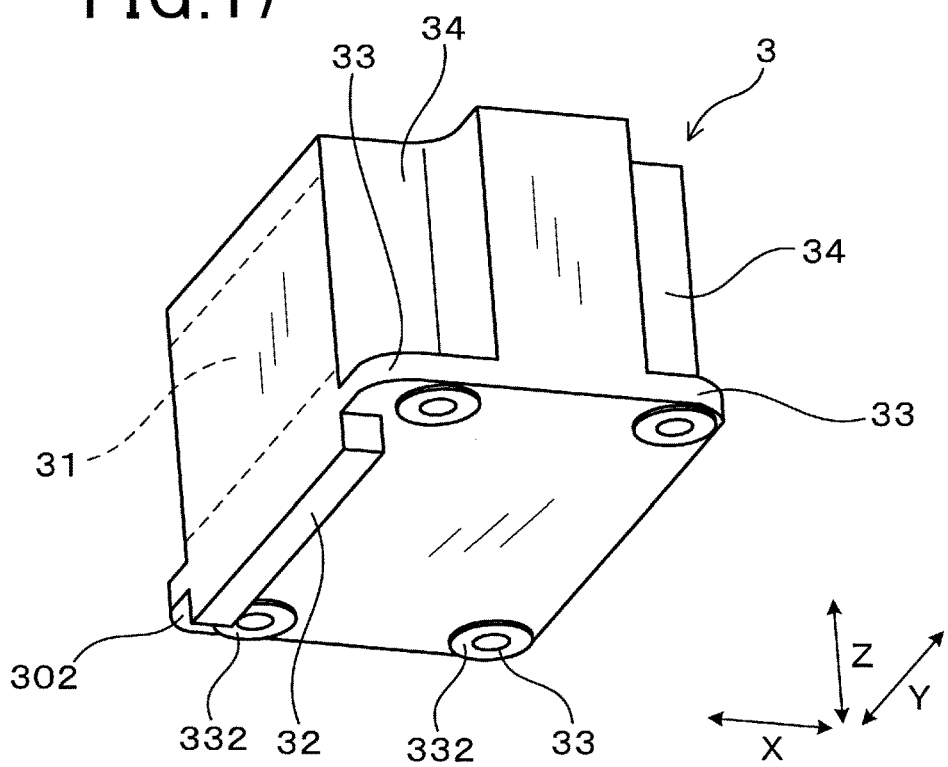
FIG. 17 is another perspective view of the reactor according to the second embodiment.

As shown in FIGS. 11, 16 and 17, the fastening member 33 is provided in the vicinity of each of the four corner portions in the lower end part of the reactor 3. The reactor 3 has a concaved part 34 which is curved inward the reactor 3 at each of the four corner portions when viewed from the height direction Z. The concaved part 34 is formed over the entire upper part of the fastening part 33 in the height direction Z.

Figure 10:
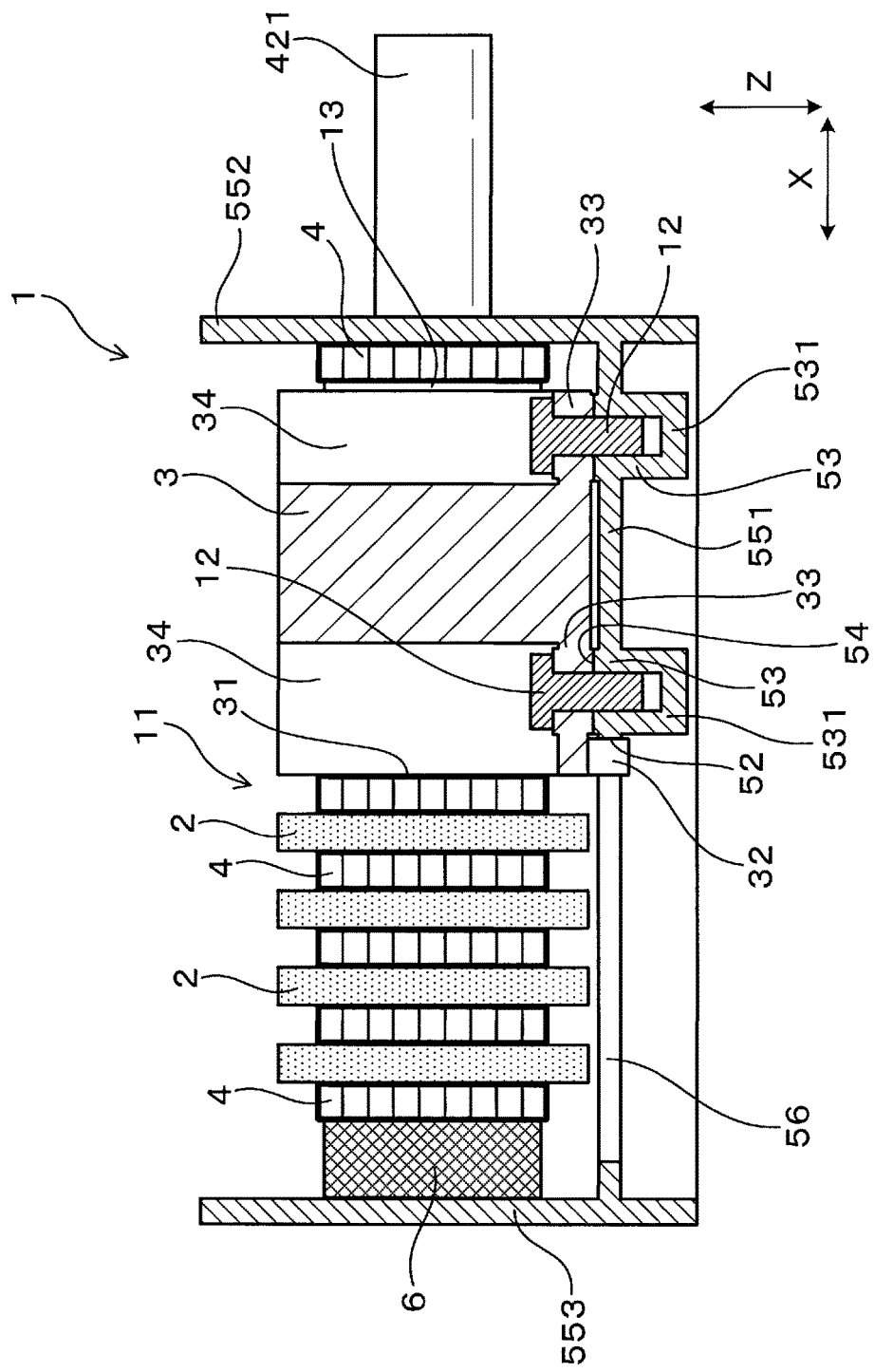
FIG. 10 is a cross-sectional view of the power conversion apparatus according to the second embodiment, sectioned along a line A-A shown in FIG. 11.

Also, as shown in FIG. 10, a female screw portion is formed at the casing fastening part 53 in the bottom plate part 551 of the casing 5 to allow the bolt 12 to be screwed. Further, as shown in FIGS. 10, 12, 14 and 15, the casing fastening part 53 has a lower protrusion 531 that protrudes downward in the height direction Z from the bottom plate part 551. The female screw portion is formed inside the lower protrusion 531. Thus, the casing fastening part 53 secures sufficient length of the female screw portion in the axial direction thereof.

Figure 15:
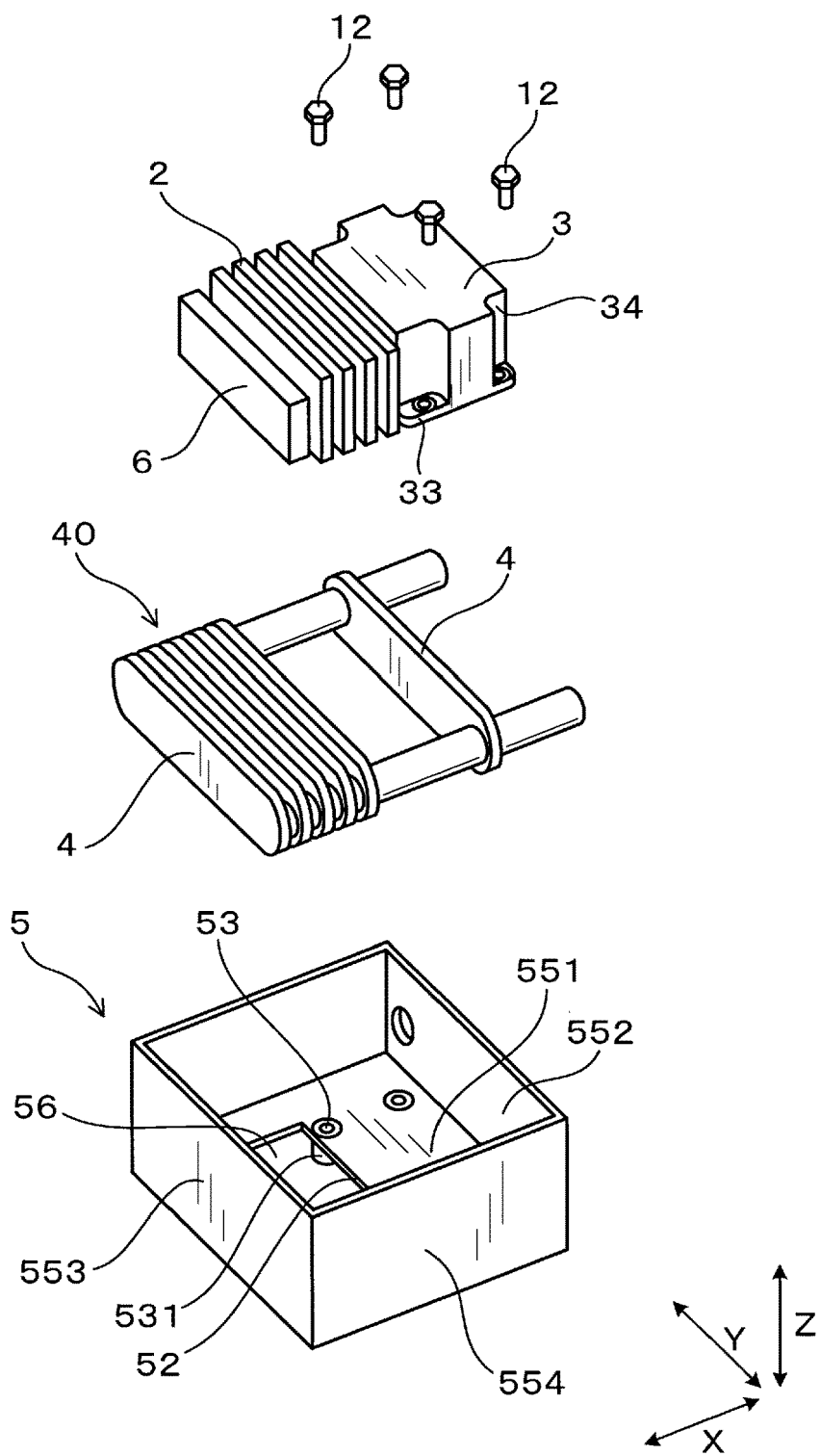
FIG. 15 is a disassembled perspective view of the power conversion apparatus according to the second embodiment.

As shown in FIGS. 10, 11 and 15, four bolts 12 are each inserted into respective four fastening parts 33 and screwed into the casing fastening part 53, thereby fixing the reactor 3 to the bottom plate part 551 of the casing. The bolt 12 is inserted towards the lower side from the upper side in the height direction Z and screwed to the casing fastening part 53. Since the concaved part 34 is formed in the reactor 3, a fastening tool can be used to fasten the bolt 12 to the reactor 3 without interference between the fastening tool and the reactor 3.

Other configurations are the same as that of the first embodiment. Note that reference numbers as same as the one used in the previous embodiments among the reference numbers used after the second embodiment represent similar elements to the previous embodiments unless otherwise specified.

According to the present embodiment, similar effects and advantages as that of the first embodiment can be obtained.

However, according to the present embodiment, as described above, the concaved part 34 is required to be provided in the reactor 3. Hence, due to existence of the concaved part 34, space for arranging the coil and the core become small in the reactor 3. Hence, to achieve the reactor 3 having predetermined reactance properties, dimension of at least one of the lamination direction X, the width direction Y and the height direction Z has to be larger than that of the first embodiment. In other words, in this respect, the first embodiment has an advantage compared to the present embodiment in a view point of a size reduction of the reactor 3 and further a size reduction of the power conversion apparatus 1.

The present embodiment is not limited to the above-described embodiments and can be modified in various manner without departing the scope of the present disclosure. For example, the reactor 3 is provided as an electronic component in the above-described embodiment. However, the electronic component is not limited to the reactor, but may be a capacitor, a DC-DC converter or the like, for example.

The number of fastening parts of the electronic component is not limited. However, one fastening part or a plurality of fastening members may be used. In the case where the plurality of fastening parts are provided in plural portions, load supporting parts are provided between a fastening part located most closely to the load application part in the lamination direction and the load application part.

Also, the cooling part to be laminated with the semiconductor modules and the electronic components is not limited to the cooling pipe but a cooling plate having no coolant passage may be used, for example.

What is claimed is:
1. A power conversion apparatus comprising:
a semiconductor module;
an electronic component electrically connected to the semiconductor module;
a cooling member that cools the semiconductor module and the electronic component, the cooling member being laminated with the semiconductor module and the electronic component to form a laminate;
a casing that accommodates the laminate; and
a pressurizing member that pressurizes the laminate in a lamination direction,
wherein
the electronic component includes:
a load application part that receives a load caused by pressurizing force of the pressurizing member on a surface of the casing adjacent the pressurizing member in the lamination direction;
a load supporting part that comes into contact with a surface of a contact part of the casing in the lamination direction, the surface of the contact part opposite to the surface of the casing adjacent the pressurizing member; and
a fastening part fastened to a casing fastening part of the casing,
the load supporting part is disposed between the load application part and the fastening part with respect to the lamination direction;
a moment of force around the load supporting part is produced in the electronic component by the load applied to the load application part; and
the moment causes the electronic component to be pressed towards a pressed part which constitutes a part of the casing.
2. The power conversion apparatus according to claim 1, wherein
the casing fastening part is provided to the pressed part.
3. The power conversion apparatus according to claim 2, wherein
the fastening part is fastened to the casing fastening part by a fastening member; and
a direction of fastening force of the fastening member corresponds to a direction of a pressing force between the electronic component and the pressed part.
4. The power conversion apparatus according to claim 3, wherein the fastening member is configured as a bolt, the bolt being inserted into the fastening part from the casing fastening member.

5. The power conversion apparatus according to claim 1, wherein
the load application part is configured to be perpendicular to the pressed part.

6. The power conversion apparatus according to claim 1, wherein
the load supporting part is configured such that a dimension in a width direction which is perpendicular to the lamination direction and parallel to the pressed part is larger than a dimension of a height direction which is perpendicular to both of the lamination direction and the width direction.

7. The power conversion apparatus according to claim 1, wherein
the load supporting part is configured such that a dimension in a width direction which is perpendicular to the lamination direction and parallel to the pressed part is smaller than a dimension of the electronic component in the width direction.

8. The power conversion apparatus according to claim 7, wherein
the load supporting part is formed in a position shifted in the width direction with respect to the fastening part.

* * * * *